(12) United States Patent
Tanaka

(10) Patent No.: US 7,375,010 B2
(45) Date of Patent: May 20, 2008

(54) LASER IRRADIATION DEVICE

(75) Inventor: Koichiro Tanaka, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 11/594,881

(22) Filed: Nov. 9, 2006

(65) Prior Publication Data

US 2007/0054479 A1  Mar. 8, 2007

Related U.S. Application Data

(62) Division of application No. 10/424,874, filed on Apr. 29, 2003, now Pat. No. 7,135,390, which is a division of application No. 09/637,905, filed on Aug. 14, 2000, now Pat. No. 6,563,843.

(30) Foreign Application Priority Data

Aug. 13, 1999 (JP) ................................. 11-229515
Aug. 11, 2000 (JP) ............................... 2000-244220

(51) Int. Cl.
*H01L 21/20* (2006.01)
*H01L 21/36* (2006.01)
(52) U.S. Cl. ............................... 438/487; 257/E21.134
(58) Field of Classification Search ................. 438/487
See application file for complete search history.

(56) References Cited

U.S. PATENT DOCUMENTS 4,330,363 A    5/1982    Biegesen et al.

(Continued)

FOREIGN PATENT DOCUMENTS

EP    0 080 597    6/1983
JP    07-130652    5/1995
JP    09-234579    9/1997

OTHER PUBLICATIONS

P. Dainesi et al., *Optimization of a Beam Delivery System for a Short-Pulse KrF Laser Used for Material Ablation*, Applied Optics, vol. 36, No. 27, Sep. 20, 1997, pp. 7080-7085.

(Continued)

*Primary Examiner*—W. David Coleman
(74) *Attorney, Agent, or Firm*—Eric J. Robinson; Robinson Intellectual Property Law Office, P.C.

(57) ABSTRACT

In annealing a non-single crystal silicon film through the use of a linear laser beam emitted by a YAG laser of a light source, it is the object of the present invention to prevent heterogeneity in energy caused by an optical interference produced in the linear laser beam from having an effect on the silicon film. The laser beam is divided by a mirror 604 shaped like steps into laser beams which have an optical path difference larger than the coherence length of the laser beam between them. The divided laser beams are converged on an irradiate surface 611 by the action of a cylindrical lens array 605 and a cylindrical lens 606 to homogenize the energy of the laser beam in the length direction and to determine the length of the linear laser beam. On the other hand, the laser beams divided by a cylindrical lens array 607 are converged on the irradiate surface 611 by a cylindrical lens 608 and a doublet cylindrical lens 609 to homogenize the energy in the width direction of the laser beam and to determine the width of the linear laser beam. Interference fringes parallel to the width direction of the linear laser beam disappears in the linear laser beam by the action of a mirror 604 shaped like steps. If the silicon film is annealed by the linear laser beam while the linear laser beam is being shifted in the width direction of the linear laser beam, the silicon film is remarkably homogenized as compared with a conventional silicon film.

12 Claims, 12 Drawing Sheets

TOP VIEW

U.S. PATENT DOCUMENTS

| | | |
|---|---|---|
| 4,475,027 A | 10/1984 | Pressley |
| 4,733,944 A | 3/1988 | Fahlen et al. |
| 4,974,919 A | 12/1990 | Muraki et al. |
| 5,005,969 A | 4/1991 | Kataoka |
| 5,081,637 A | 1/1992 | Fan et al. |
| 5,185,758 A | 2/1993 | Fan et al. |
| 5,432,122 A | 7/1995 | Chae |
| 5,529,951 A | 6/1996 | Noguchi et al. |
| 5,534,970 A | 7/1996 | Nakashima et al. |
| 5,561,081 A | 10/1996 | Takenouchi et al. |
| 5,643,826 A | 7/1997 | Ohtani et al. |
| 5,808,323 A | 9/1998 | Spaeth et al. |
| 5,815,494 A | 9/1998 | Yamazaki et al. |
| 5,867,324 A | 2/1999 | Kmetec et al. |
| 5,923,962 A | 7/1999 | Ohtani et al. |
| 6,100,961 A | 8/2000 | Shiraishi et al. |
| 6,178,035 B1 | 1/2001 | Eda et al. |
| 6,212,012 B1 | 4/2001 | Tanaka |
| 6,215,595 B1 | 4/2001 | Yamazaki et al. |
| 6,285,042 B1 | 9/2001 | Ohtani et al. |
| 6,335,541 B1 | 1/2002 | Ohtani et al. |
| 6,373,870 B1 | 4/2002 | Yamazaki et al. |
| 6,535,535 B1 | 3/2003 | Yamazaki et al. |
| 6,573,162 B2 | 6/2003 | Tanaka et al. |

OTHER PUBLICATIONS

Search Report (Application No. 00117451.5) Dated Dec. 12, 2006.

Endert et al., "Excimer Laser: A New Tool For Precision Micromachining," Optical and Quantum Electronics, vol. 27, 1995, pp. 1319-1335.

Helen et al., "Reproducible High Field Effect Mobility Polysilicon Thin Film Transistors Involving Pulsed Nd:YVO$_4$ Laser Crystallization," IEDM 99, IEEE, 1999, pp. 297-300.

Hayashi et al., "Fabrication of Low-Temperature Bottom-Gate Poly-Si TFTs on Large-Area Substrate by Linear-Beam Excimer Laser Crystallization and Ion Doping Method," IEDM 95, IEEE, 1995, pp. 829-832.

SECTIONAL VIEW

TOP VIEW

TOP VIEW

TOP VIEW

TOP VIEW

LASER IRRADIATION DEVICE

Divisional of prior application Ser. No. 10/424,874 filed Apr. 29, 2003, now U.S. Pat. No. 7,135,390, which is a divisional application of application Ser. No. 09/637,905 filed Aug. 14, 2000, now U.S. Pat. No. 6,563,843

BACKGROUND OF THE INVENTION

1. Field of the Invention

The present invention relates to a device for manufacturing a semiconductor device having a circuit constituted by a thin film and, or example, to a device for manufacturing an electro-optical device typified by a liquid display device and an electric device having the electro-optical device as a part. In this connection, in the present specification, a semiconductor device designates in general a device capable of functioning by the use of semiconductor characteristics and includes the above electro-optical device and electric device.

2. Description of the Related Art

In recent years, research and development have been widely conducted on the technologies for performing a laser annealing processing to an amorphous semiconductor film or a crystalline semiconductor film (semiconductor film which is not a single crystal but a polycrystal or a microcrystal), that is, non-single crystal semiconductor film formed on an insulating substrate such as a glass substrate or the like to crystallize the non-single crystal semiconductor film or to improve its crystallinity. A silicon film is often used as the above semiconductor film.

A glass substrate has advantages that it is cheap and has good workability and is easy to make a large area substrate in comparison with a quartz substrate which has been conventionally used. This is because the above research and development have been carried out. Also, it is because the melting point of the glass substrate is low that a laser is widely used for crystallizing the semiconductor film. The laser can apply high energy only to a non-single crystal film without increasing the temperature of the substrate too much.

The crystalline silicon film is called a polycrystalline silicon film or a polycrystalline semiconductor film because it is made of many crystal grains. Since the crystalline silicon film subjected to a laser annealing processing has high mobility, a thin film transistor (hereinafter referred to as TFT) is formed by the use of the crystalline silicon film and, for example, is widely used for a monolithic liquid crystal electro-optical device having a glass substrate and TFTs for driving a pixel and for a driving circuit.

Also, a laser annealing method of transforming the high-power laser beam of a pulse oscillation such as an excimer laser into a square spot several cm square or a linear beam 10 cm or more in length at an irradiate surface by the use of an optical system and of scanning a semiconductor film with the laser beam (or moving a spot irradiated with the laser beam relatively to an irradiate surface) has been widely used because it increases mass productivity and is excellent in an industrial view point.

In particular, when a linear laser beam is used, the whole irradiate surface is irradiated with the linear laser beam only by scanning the irradiate surface in the direction perpendicular to the direction of the line of the linear laser beam, which therefore produces high mass productivity. In contrast to this, when a spot-like laser beam is used, the irradiate surface needs to be scanned with the laser beam in the back-and-forth direction and in the right-and-left direction. The irradiate surface is scanned with the linear laser beam in the direction perpendicular to the direction of the line of the linear laser beam because the direction is the most efficient scanning direction. The method of using the linear laser beam into which the laser beam emitted from the excimer laser of pulse oscillation is transformed by the use of a suitable optical system for the laser annealing processing has become a mainstream technology.

In FIG. 1 is shown an example of the constitution of an optical system for transforming the cross section of the laser beam into a linear shape at an irradiate surface. This constitution is extremely ordinary and all the above optical systems are similar to FIG. 1. This constitution not only transforms the cross section of the laser beam into the linear shape but also homogenizes the energy of the laser beam at the irradiate surface. In general, an optical system homogenizing the energy of the beam is called a beam homogenizer.

In the case where an excimer laser which is ultraviolet radiation is used as a light source, it is recommended that the base material of the above optical system be quartz because the quartz can produce a high transmittance. Also, it is recommended to use a coating capable of producing a transmittance of 99% or more to the wavelength of the excimer laser.

First, a side view in FIG. 1 will be described. A laser beam emitted by a laser oscillator 101 is divided into the direction orthogonal to the direction of travel of the laser beam by cylindrical lens arrays 102a and 102b. The applicable direction is called a vertical direction in the present specification. When a mirror is arranged in the middle of the optical system, the above vertical direction is bent in the direction of the light bent by the mirror. In this constitution, the laser beam is divided into four portions. These divided laser beams are once unified to one laser beam by a cylindrical lens 104. The unified laser beam is reflected by a mirror 107 and then is again focused on one laser beam at an irradiate surface 109 by a doublet cylindrical lens 108. The doublet cylindrical lens means the one constituted by two cylindrical lenses. The doublet lens homogenizes the energy in the width direction of the linear laser beam and determines a length in the width direction of the laser beam.

Next, a top view will be described. The laser beam emitted by the laser oscillator 101 is divided by cylindrical lens arrays 103 into the direction orthogonal to the direction of travel of the laser beam and in the direction orthogonal to the vertical direction. The applicable direction is called a lateral direction in the present specification. When a mirror is arranged in the middle of the optical system, the above lateral direction is bent in the direction of the light bent by the mirror. In this constitution, the laser beam is divided into seven portions. These divided laser beams are once converged on one laser beam at the irradiate surface 109 by the cylindrical lens 105. This homogenizes the energy in the length direction of the linear laser beam and determines the length of the linear laser beam.

The above lenses are made of synthetic quartz to respond to the excimer laser. Also, their surfaces are coated such that they well transmit the excimer laser, whereby the transmittance of one lens to the excimer laser is made 99% or more.

The linear laser beam transformed by the above constitution is applied to the non-single crystal silicon film while it is gradually shifted and superposed in the direction of the width of the linear laser beam to subject the whole surface of the non-single crystal silicon film to laser annealing to thereby crystallize the non-single crystal silicon film or to improve the crystallinity thereof.

Next, a typical method of forming a semiconductor film to be irradiated with the laser beam will be described.

First, a Corning 1737 substrate 0.7 mm thick and 5 inch square was prepared as a substrate. A $SiO_2$ film (silicon oxide film) having a thickness of 200 nm was formed on the substrate with a plasma CVD device and the amorphous silicon film (hereinafter referred to as "a-Si film") having a thickness of 50 nm was formed on the surface of the $SiO_2$ film.

The substrate was heated at 500° C. in a nitrogen atmosphere for 1 hour to reduce the concentration of hydrogen in the film, whereby the resistance to laser of the film was remarkably improved.

A XeCl excimer laser L3308 (wavelength=308 nm, pulse width=30 ns) made by Ramda Corp. was used as a laser device. The laser device generates a pulse oscillation laser and has a capacity producing an energy of 500 mJ/pulse. The size of the laser beam is 10-30 mm (both in full width at half maximum) at the exit of the laser beam. The exit of the laser beam is defined, in the present specification, as a plane perpendicular to the direction of travel of the laser beam right after the laser beam is emitted by the laser irradiation device.

In general, the shape of the laser beam generated by the excimer laser is rectangular and ranges from 3 to 5 when expressed in aspect ratio, and as the position is nearer to the center of the laser beam, the intensity of the laser beam is stronger, that is, the intensity of the laser beam shows a Gaussian distribution. The size of the above laser beam was transformed into a linear laser beam of 125 mm×0.4 mm having a uniform energy distribution by an optical system having a constitution shown in FIG. 1.

According to the experiment of the present inventor, it was found that the pitch of superposition of 1/10 times the width (full width at half maximum) of the linear laser beam was most suitable in the case where the above semiconductor film was irradiated with the linear laser beam. This improved homogeneity in crystallinity in the film. In the above example, the above full width at half maximum was 0.4 mm and hence the semiconductor film was scanned and irradiated with the laser beam of the excimer laser at a pulse frequency of 30 Hz, at a scanning speed of 1.0 mm/sec, at an energy density of 420 mJ/cm² at the surface irradiated with the laser beam. The above-described method is an extremely ordinary method used for crystallizing a semiconductor film by the use of the linear laser beam.

When the silicon film annealed with the above linear laser beam was very carefully observed, very weak interference fringes were observed. This is because when the divided laser beams were again converged on one region, the divided laser beams interfered with each other. However, since the excimer laser has a coherence length ranging from about several micron to several tens micron, it does not produce strong interference.

The state of the art in the excimer laser can oscillate high-power, high-repetition pulses (about 300 Hz) and hence is widely used for crystallizing the semiconductor film. When the liquid crystal display using a low-temperature polysilicon TFT, which has been brought to a commercial stage in recent years, was manufactured, the excimer laser is widely used in the crystallization process of the semiconductor film.

In recent years, the maximum power of a YAG laser has been remarkably increased. Since the YAG laser is a solid state laser, it is easy to handle and maintain as compared with the excimer laser which is a gas laser. The present inventor considered the possibility of the YAG laser being used for crystallizing the semiconductor film in consideration of the increasing power of the YAG laser.

It is well known that the YAG laser emits a laser beam having a wavelength of 1065 nm as a fundamental wave. The absorption coefficient of the silicon film to the laser beam is very low and hence can not be used in this state for crystallizing the a-Si film which is one of the silicon films. However, the laser beam can be converted into the laser beams having shorter wavelengths by the use of the non-linear optical crystal. The converted laser beams are called the second harmonic (533 nm), the third harmonic (355 nm), the fourth harmonic (266 nm), and the fifth harmonic (213 nm), depending on the converted wavelength.

Since the second harmonic has a wavelength of 533 nm and has a sufficient absorption coefficient to the a-Si film, it can be used for crystallizing the a-Si film. However, its absorption coefficient to the a-Si film is not so high as that of the excimer laser. The third harmonic, the fourth harmonic, and the fifth harmonic are very high in the absorption coefficient to the a-Si film and hence can crystallize the semiconductor film with a high degree of energy efficiency.

The maximum power of the third harmonic of the state-of-the-art YAG laser is about 750 mJ/pulse. Also, the maximum power of the fourth harmonic is about 200 mJ/pulse. The maximum power of the fifth harmonic is lower than the above maximum power and hence the fifth harmonic is not suitable for crystallizing the semiconductor film. From the viewpoint of both the power and the absorption coefficient to the a-Si film of the laser beam, it is best at the present time to use the second harmonic or the third harmonic.

Next, in the case where the YAG laser is used for crystallizing the semiconductor film, it is preferable for mass production that the shape of the laser beam at the irradiate surface is linear. It is preferable that the above optical system is applied to the YAG laser as it is. This possibility will be considered in the following.

First, the difference between the YAG laser and the excimer laser will be described. The shape of the laser beam emitted by the excimer laser is generally rectangular and the shape of the laser beam emitted by the excimer laser is generally circular. The dominating size of the laser beam having large power exceeding 500 mJ/pulse and high repetition over 200 Hz is about 10-30 mm and the above optical system is tailored to the size of the laser beam. On the other hand, the size of the laser beam of the YAG laser over 500 mJ/pulse is a circle having a diameter of about 10 mm. In order to tailor the YAG laser 10 mm in diameter to the above optical system, it is recommended that the circular laser beam be transformed into an ellipsoidal one by the use of the beam expander capable of changing the size of the laser beam. In this case, it is recommended that the above circular laser beam be elongated by three times to an ellipsoidal laser beam 30 mm in long diameter and 10 mm in short diameter by the use of the beam expander constituted by cylindrical lenses capable of elongating the size of the laser beam in one direction.

An example of an optical system in which the above beam expander is built in the optical system shown in FIG. 1 to be adapted to the YAG laser 300 will be shown in FIG. 3. FIG. 3 shows only a top view. In FIG. 3 and FIG. 1, the same reference numerals designate the lenses having the same shape.

A cylindrical lens 301 has a focal length of 100 mm, a length and a width of 50 mm, and a thickness of 10 mm. A laser beam enters the cylindrical lens 301. A cylindrical lens 302 has a focal length of 200 mm, a length and a width of 50 mm, and a thickness of 10 mm. These lenses are arranged at a distance of 400 mm from each other. This elongates the laser beam three times in one direction.

Next, the difference in coherence length between the YAG laser and the excimer laser will be described. As described above, the excimer laser has a coherence length of about several micron to several tens micron and hence produces a very weak optical interference when the laser beam emitted by the excimer laser passes through an optical system for dividing the laser beam and then converging it on one point. On the other hand, the YAG laser has a very long coherence length of 1 cm and hence the effect of interference produced by the YAG laser is not negligible.

If the laser beam emitted by the YAG laser is passed through the optical system shown in FIG. 3 to be transformed into a linear laser beam 200, the linear laser beam 200 has an energy distribution in which energy is repeatedly increased or decreased like a grid pattern.

The energy distribution shaped like a grid pattern is produced by an optical interference. In FIG. 2A, dark lines 201 designate regions having comparatively high energy and blank lines 202 between the dark lines 201 designate regions having comparatively low energy.

If the a-Si film is crystallized with the linear laser beam 200 having the energy distribution shaped like a grid pattern, the a-Si film is heterogeneously crystallized. FIG. 2B shows the surface of a silicon film 203 crystallized with the linear laser beam. As described above, since the a-Si film is irradiated with the linear laser beam while the linear laser beam is shifted and superposed by 1/10 times in the width direction of the laser beam, interference fringes parallel to the line direction of the linear laser beam cancel each other to become light, but interference fringes 204, 205 parallel to the width direction of the linear laser beam remain strongly dark. In FIG. 2B, dark lines 204 designate regions having comparatively high energy and blank lines 205 between the dark lines 204 designate regions having comparatively low energy.

SUMMARY OF THE INVENTION

It the object of the present invention to solve the above-mentioned problems and to provide a laser irradiation device for producing a polycrystalline silicon film having few interference fringes.

The present inventor has invented an optical system reducing an interference phenomenon by using the property that light beams emitted by the same light source do not interfere with each other if the light beams have an optical path difference of a coherence length or more between them. The present invention solves the above-mentioned problems, in particular, by canceling interference fringes produced in parallel to the direction of width of the linear laser beam.

To cancel the interference fringes produced in parallel to the direction of width of the linear laser beam, it is only essential that the optical path difference between the laser beams divided in the lateral direction is larger than the coherence length of the laser beam emitted by a light source. The light source of the laser beam used in the present invention is a YAG laser and the coherence length of the laser beam is about 1 cm.

An example of an optical system realizing the above state will be shown in FIG. 4. The big difference between the optical system shown in FIG. 4 and the one shown in FIG. 3 is a reflecting mirror 401. In FIG. 4 and FIG. 3, the same reference numerals designate the lenses having the same shape.

A mirror 401 having a reflecting surface shaped like steps is arranged behind cylindrical lenses 301 and 302 forming a beam expander. The mirror 401 plays a role in making laser beams having optical path differences enter cylindrical lenses of a cylindrical lens array 402. For example, a laser beam entering one reflecting surface 401a of the mirror 401 changes the direction of travel and enters one cylindrical lens 402a forming the cylindrical lens array 402. Similarly, a laser beam entering one reflecting surface 401b other than the reflecting surface 401a changes the direction of travel and enters one cylindrical lens 402b forming the cylindrical lens array 402.

Since the mirror 401 is shaped like steps, the optical path length of the laser beam between the exit of the laser beam of the YAG laser and the entry of the laser beam to the cylindrical lens 402a is different by a length d from the optical path length of the laser beam between the exit of the laser beam of the YAG laser and the entry of the laser beam to the cylindrical lens 402b. If the length d is larger than the coherence length of the YAG laser, the laser beam emitted from the cylindrical lens 402a and the laser beam emitted from the cylindrical lens 402b do not interfere with each other at an irradiate surface.

The cylindrical lens array 402 similarly acts as the cylindrical lens array 103 and divides the laser beam in the lateral direction. The laser beam divided by the cylindrical lens array 402 is converged on an irradiate surface 404.

A constitution for dividing the laser beam in the vertical direction and then converging it on the irradiate surface may be an optical system similar to the conventional optical system shown in FIG. 1. The energy distribution of the linear laser beam produced in this way becomes a distribution having fringes parallel to the direction of length of the laser beam 500 shown in FIG. 5A. This distribution having fringes is produced by an optical interference. In FIG. 5A, dark lines 501 designate regions having relatively high energy and blank lines 502 between the dark lines 501 designate regions having relatively low energy.

This is the effect of the mirror 401 shaped like steps and the energy distribution having fringes parallel to the direction of width of the linear laser beam disappears. In FIG. 5B will be shown the surface of the silicon film 503 crystallized with the linear laser beam. As described above, since the a-Si film is irradiated with the linear laser beam while the linear laser beam is shifted and superposed in the width direction of the linear laser beam by about 1/10 times the width of the above linear laser beam, fringes parallel to the direction of line of the linear laser beam cancel each other and hence are not much conspicuous.

This can cancel fringes produced in the width direction of the linear laser beam which might be produced when the semiconductor film is annealed with the linear laser beam of the YAG laser.

Another means for producing an optical path difference to the laser beam is a transparent plate. If the transparent plate is put before a cylindrical lens forming a cylindrical lens array, it can change only the optical path length of the laser beam entering the cylindrical lens. However, in general, the refractive index (ranging from 1.4 to 2.5) of the transparent plate to the laser beam is not so large and hence, to produce an optical path difference larger than the coherence length of the laser beam, the thickness of the transparent plate is required to be three times the above coherence length.

The present invention can be applied to all laser irradiation devices using not only the YAG laser but also an Ar laser or the like and, in particular, is effectively applied to the laser irradiation device having a long coherence length of 0.1 mm or more. Conversely, the present invention does not produce a remarkable effect to the laser irradiation device having a coherence length of 0.1 mm or less.

That is, the present invention is a laser irradiation device for applying a laser beam the cross section of which is linear at an irradiate surface, the device comprising:

a laser oscillator for outputting a laser beam;

an optical system for transforming the cross section of the laser beam into a linear shape; and a stage moving at least in one direction; wherein the optical system comprising:

an optical system 1 playing a role in dividing the laser beam in the perpendicular direction to the travel direction of the laser beam (corresponding to 607a and 607b in FIG. 6);

an optical system 2 playing a role in converging the divided laser beams by the optical system 1 on an irradiate surface and in homogenizing the energy of the laser beam in the width direction of the laser beam the cross section of which is linear at the irradiate surface (corresponding to 608 and 609 in FIG. 6);

an optical system 3 playing a role in dividing the laser beam in a direction which is included in a perpendicular face to the perpendicular direction and in a direction perpendicular to the travel direction of the laser beam (corresponding to 605 in FIG. 6);

an optical system 4 playing a role in converging the divided laser beams by the optical system 3 on an irradiate surface and in homogenizing the energy of the laser beam in the length direction of the laser beam the cross section of which is linear at the irradiate surface (corresponding to 606 in FIG. 6); and means for making the difference in the optical path length (which is from the exit of the laser beam to the irradiate surface) between the laser beams divided by the optical system 3 larger than the coherence length of the laser beam (corresponding to 604 in FIG. 6).

Also, another constitution of the present invention is a laser irradiation device for applying a laser beam the cross section of which is linear at an irradiate surface, the device comprising:

a laser oscillator for outputting a laser beam;

an optical system for transforming the cross section of the laser beam into a linear shape; and a stage moving at least in one direction;

wherein the optical system comprises:

a cylindrical lens array 1 playing a role in dividing the laser beam in perpendicular the direction to the travel direction of the laser beam (corresponding to 607a and 607b in FIG. 6);

an optical system playing a role in converging the divided laser beams by the cylindrical lens array 1 on an irradiate surface and in homogenizing the energy of the laser beam in the width direction of the laser beam the cross section of which is linear at the irradiate surface (corresponding to 608 and 609 in FIG. 6);

a cylindrical lens array 2 playing a role in dividing the laser beam in a direction which is included in a perpendicular face to the perpendicular to the perpendicular direction and in a direction perpendicular to the travel direction of the laser beam (corresponding to 605 in FIG. 6);

a cylindrical lens playing a role in converging the divided laser beams on by the cylindrical lens array 2 an irradiate surface and in homogenizing the energy of the laser bean in the length direction of the laser beam the cross section of which is linear at the irradiate surface (corresponding to 606 in FIG. 6); and means for making the difference in the optical path length (which is from the exit of the laser beam to the irradiate surface) between the laser beams divided by the cylindrical lens array 2 larger than the coherence length of the laser beam (corresponding to 604 in FIG. 6).

In any invention described above, a mirror shaped like steps can be used as the means described above.

Also, in any invention described above, it is desirable that the direction of length of the laser beam the cross section of which is linear at the irradiate surface is perpendicular to the direction of movement of the stage moving at least in one direction, because this improves productivity.

Also, in any invention described above, it is desirable that the above-mentioned laser oscillator generates the second harmonic, the third harmonic, or the fourth harmonic of a YAG laser, because the laser irradiation device is easy to maintain and produces high productivity.

Also, in any invention described above, it is desirable that the above-mentioned laser irradiation device further comprises a load/unload chamber, a transfer chamber, a robot arm, a laser irradiation chamber, and a cooling chamber, because this improves productivity.

DESCRIPTION OF THE PREFERRED EMBODIMENTS

Embodiment Mode

First, an example in which a substrate with an a-Si film 5-inch square is irradiated with a laser beam transformed into a linear shape at an irradiate surface will be described as an object to be irradiated.

A Corning glass 1737 having a thickness of 0.7 mm is used as a substrate. This substrate has a sufficient durability under a temperature of 600° C. A $SiO_2$ film is formed in 200 nm on one side of the substrate by a plasma CVD method. Further, an a-Si film is formed in 55 nm on the $SiO_2$ film. Any other film forming method, for example, a sputtering method may be used.

The substrate on which the $SiO_2$ film and the a-Si film are formed is heated in a nitrogen atmosphere at 500° C. for one hour to reduce the concentration of hydrogen in the a-Si film. This can dramatically enhance the resistance of the a-Si film to a laser. The suitable concentration of hydrogen in the a-Si film is an order of $10^{20}$ atoms/cm$^3$.

Figure 6:
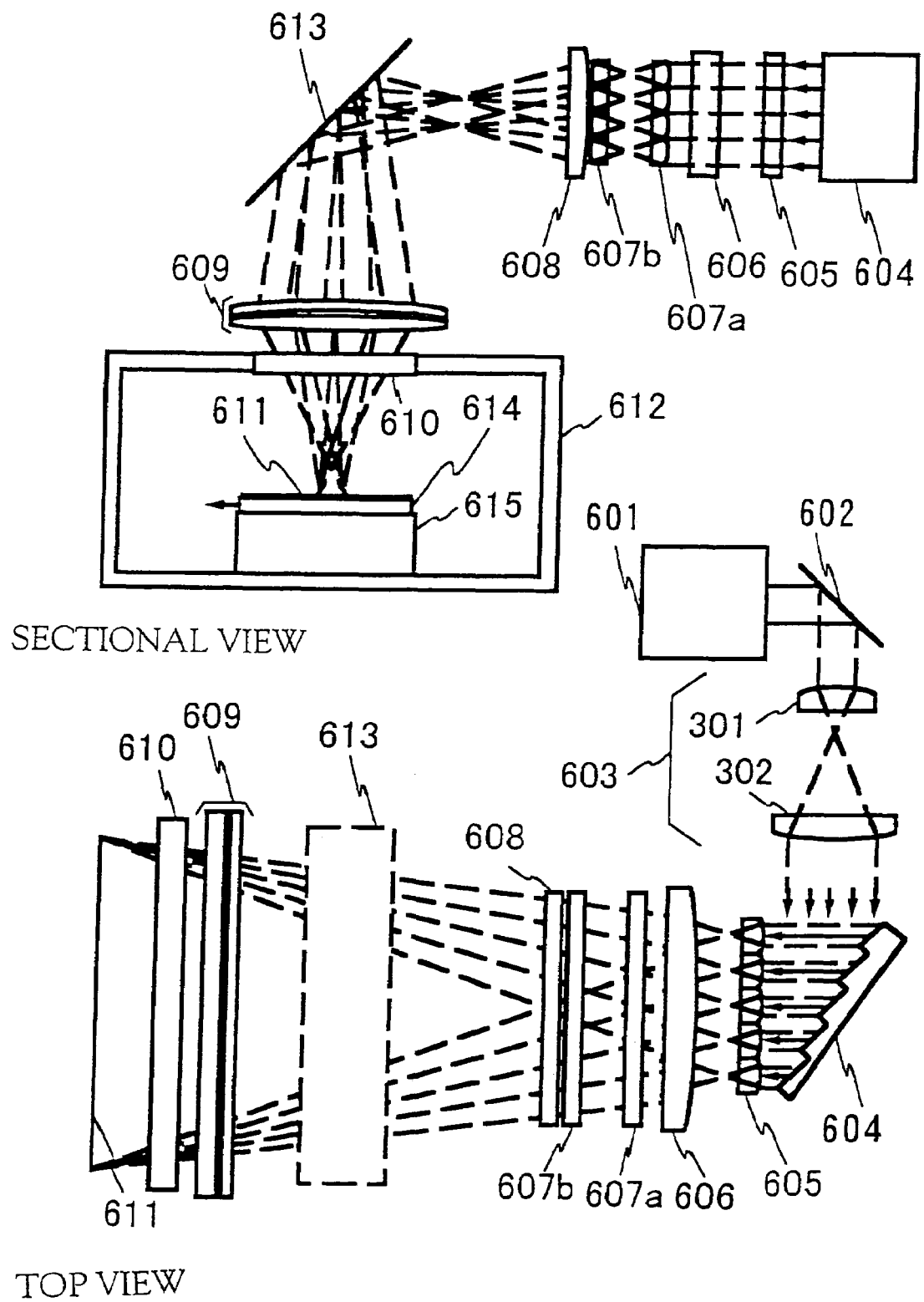
FIG. 6 is an illustration showing an example of a laser irradiation device disclosed by the present invention.

A laser irradiation device will be shown in FIG. 6. The device shown in FIG. 6 is an example of a device for irradiating a substrate with a linear laser beam. A laser beam is transformed into a linear laser beam having a length of 125 mm and a width of 0.4 mm by an optical system shown in FIG. 6. Since the length of the linear laser beam is 125 mm, when a substrate 5-inch square is scanned with the linear laser beam in one direction, almost whole surface of the substrate can be irradiated with the laser beam.

The optical system shown in FIG. 6 is an example. The linear laser beam is focused on the a-Si film. The size of the above linear laser beam is the size of the beam when the beam is focused on the a-Si film. The above constitution will be described in the following.

A YAG laser oscillator 601 of pulse oscillation type oscillates a laser beam of third harmonic (wavelength: 355 nm). The size of the above laser beam has a diameter of 10 mm at the exit of the laser beam. The maximum power of the laser beam is 500 mJ/pulse. The maximum repetition frequency is 30 Hz. A pulse width is 10 ns.

Since ultraviolet rays having a wavelength of 355 nm is used, quartz having a high transmittance in this wavelength region is used as the base material of a lens. To well transmit ultraviolet rays having a wavelength of 355 nm, it is recommended that the quartz lens be coated with a suitable material, which preferably increases energy efficiency and can expand the life of the lens.

The circular laser beam 10 mm in diameter generated by the YAG laser oscillator 601 has the direction of travel changed 90 degrees by a mirror 602. Then, the shape of the laser beam is changed into an ellipsoid 30 mm in long diameter and 10 mm in short diameter by a beam expander 603. The above beam expander 603 is constituted by cylindrical lenses 301 and 302 in combination.

The laser beam transformed into an ellipsoid enters a mirror 604 shaped like steps. Here, the laser beam enters two neighboring cylindrical lenses forming a cylindrical lens array with an optical path difference d. The above optical path difference d is longer than the coherence length of the YAG laser oscillator 601. Since the coherence length of the YAG laser oscillator 601 is about 1 cm, if the optical path difference d is longer than 1 cm, it can prevent an optical interference.

Figure 7:
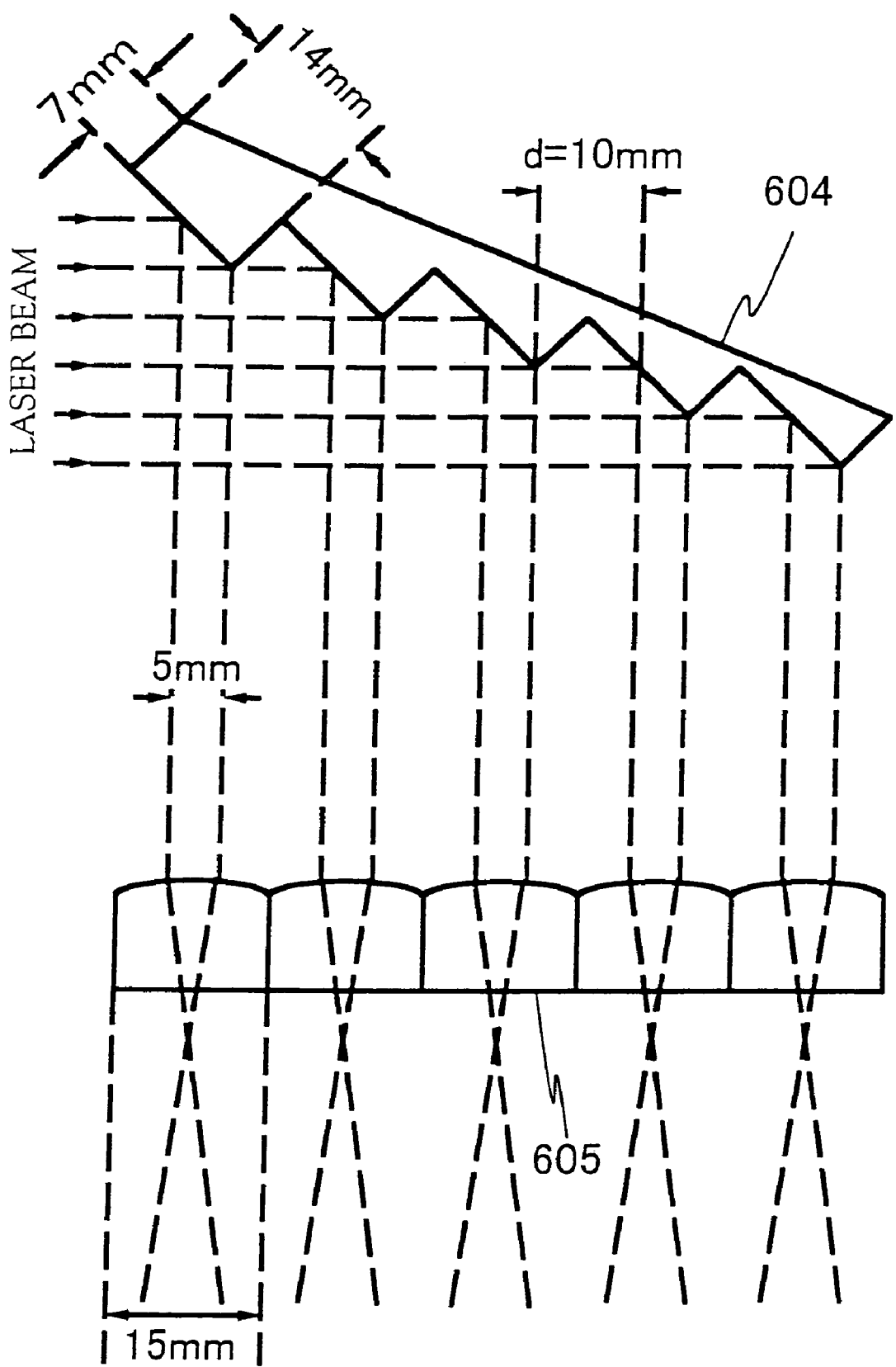
FIG. 7 is an illustration showing a part of an optical system forming a laser beam which is disclosed by the present invention.

It is recommended that the optical path difference d be adjusted by adjusting the height of the step when the mirror 604 shaped like steps is formed. In FIG. 7 will be shown an example of the mirror 604 shaped like steps in which optical path difference d is 1 cm. The number of steps of the mirror 604 shaped like steps is five. The width of each step is 14 mm and the height of each step is 7 mm. When the laser beam enters the mirror 604 shaped like steps from the direction in which when parallel light enters the above mirror 604 shaped like steps, the parallel light casts shadows 7 mm in width on the steps, the laser beams reflected by each step enter two neighboring cylindrical lenses forming the cylindrical lens array 605 with an optical path difference of 1 cm.

Figure 1:
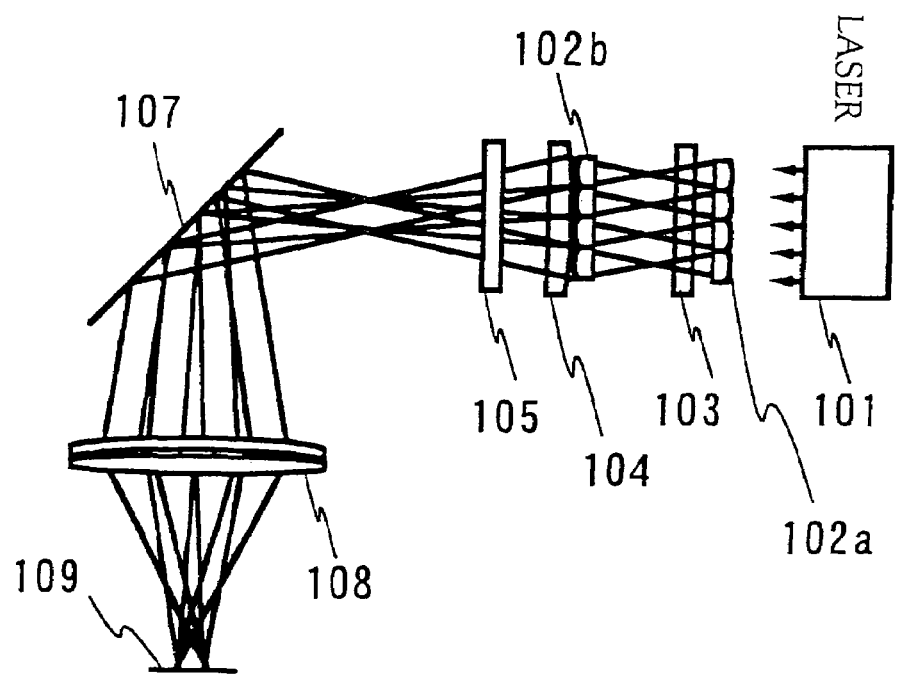
FIG. 1 illustrates a conventional optical system forming a linear laser beam.
Figure 1:
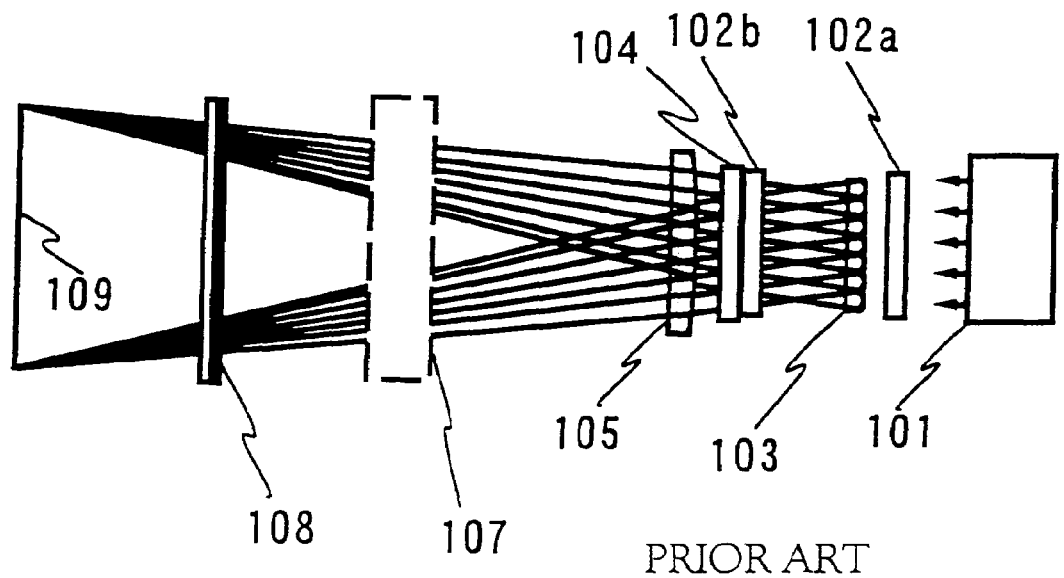
Figure 2A:
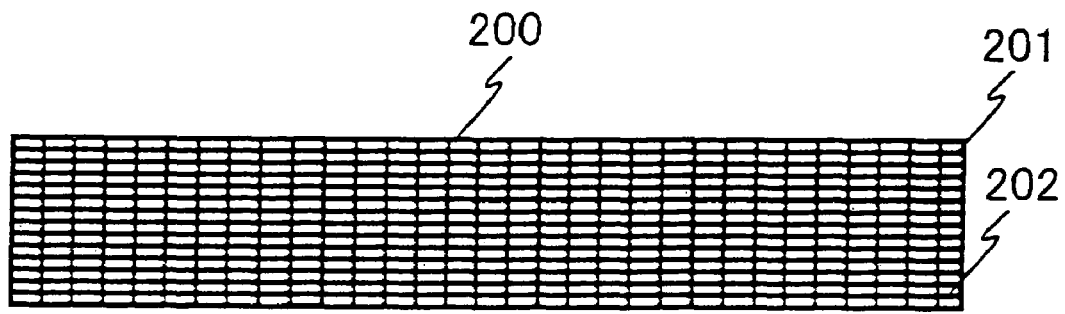
FIG. 2A is an illustration showing a conventional energy distribution of a linear laser beam and FIG. 2B is an illustration showing a conventional silicon film which is scanned and irradiated with a linear laser beam in the direction perpendicular to the length direction of the linear laser beam.
Figure 2B:
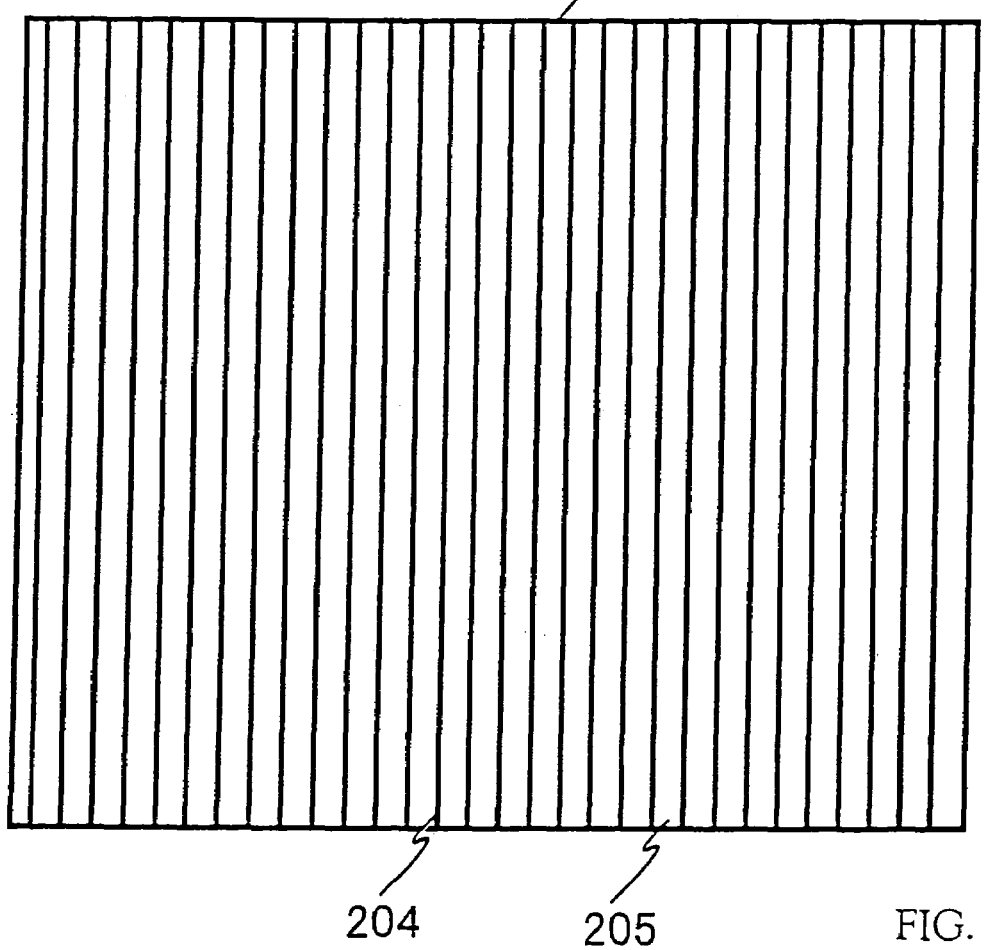
Figure 3:
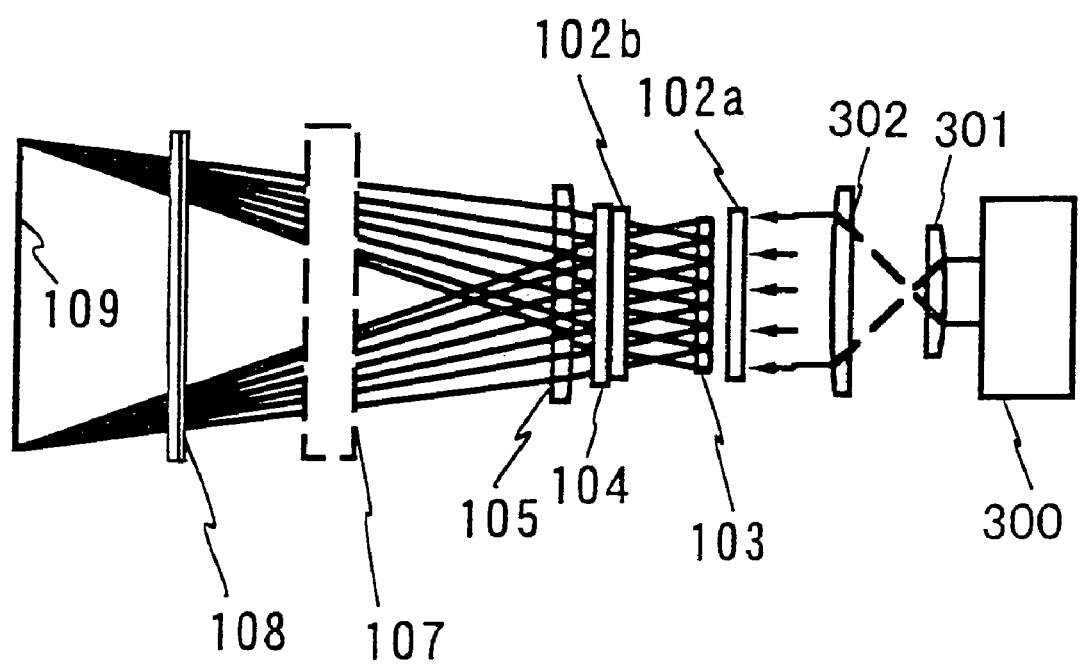
FIG. 3 is an illustration showing a conventional example of a combination of a beam expander and an optical system forming a linear laser beam.
Figure 4:
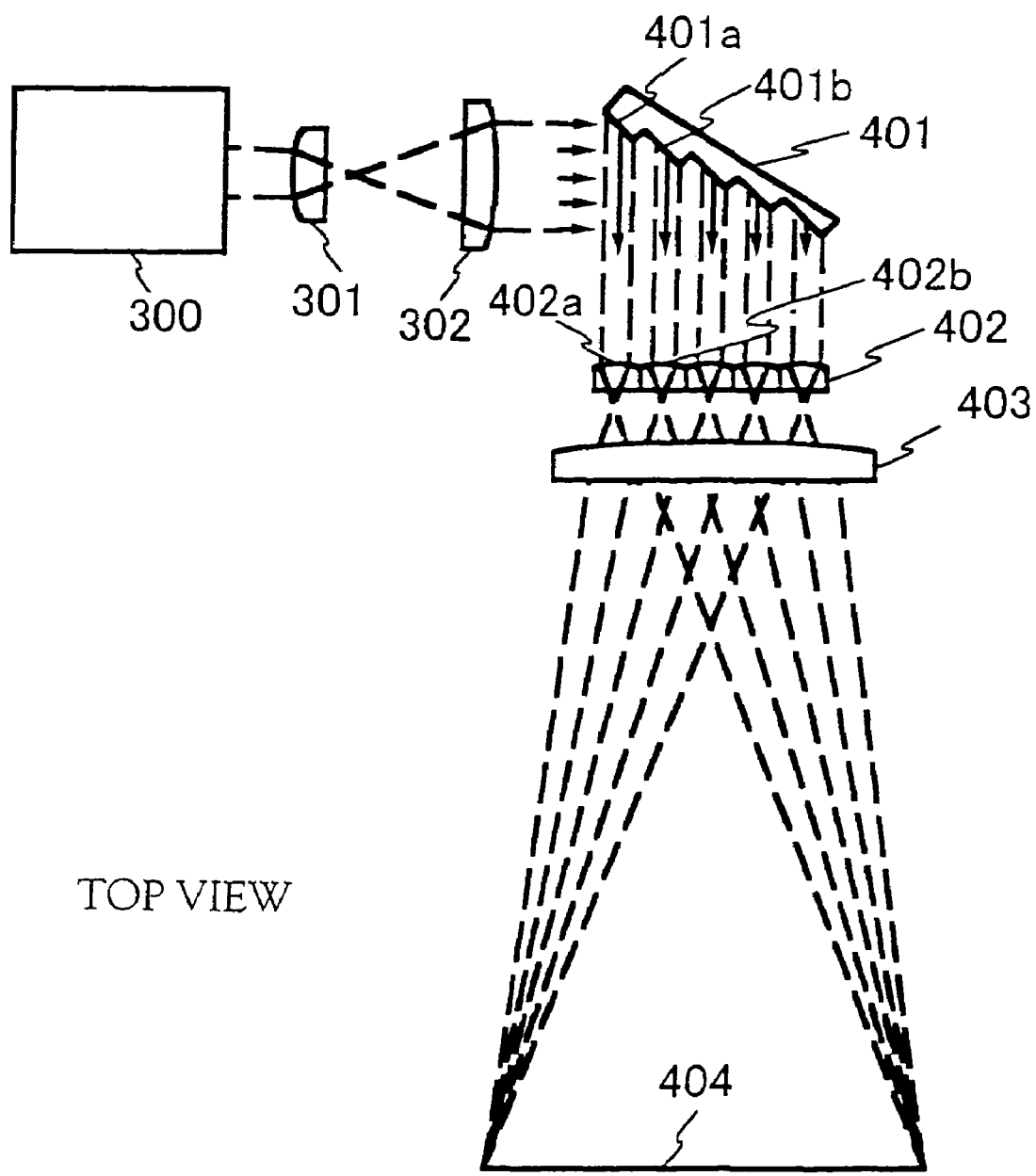
FIG. 4 is an illustration showing an example of a combination of a beam expander and an optical system forming a linear laser beam which is disclosed by the present invention.
Figure 5A:
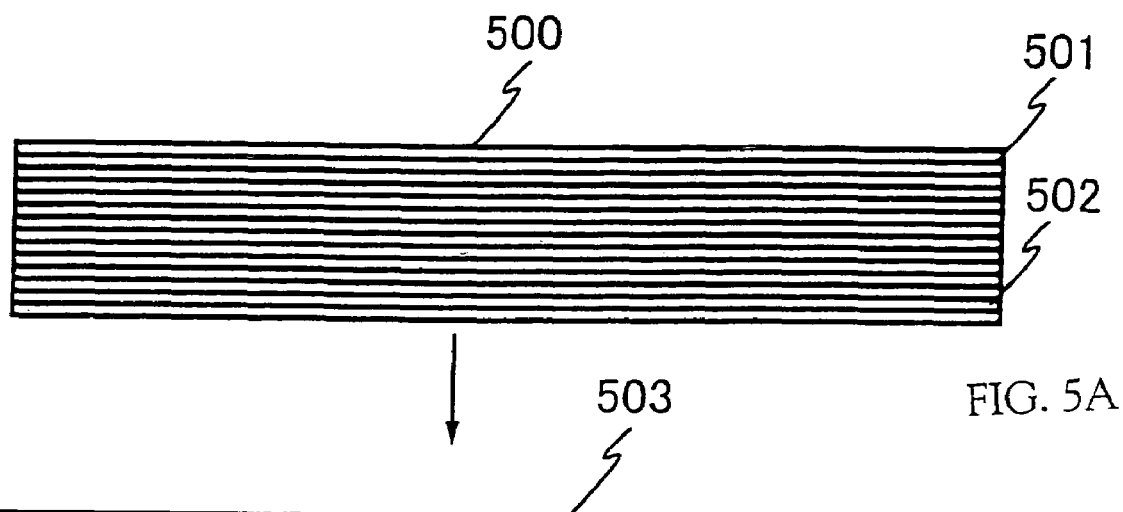
FIG. 5A is an illustration showing the energy distribution of a linear laser beam of the present invention and FIG. 5B is an illustration showing a silicon film which is scanned and irradiated with a linear laser beam in the direction perpendicular to the length direction of the linear laser beam of the present invention.
Figure 5B:
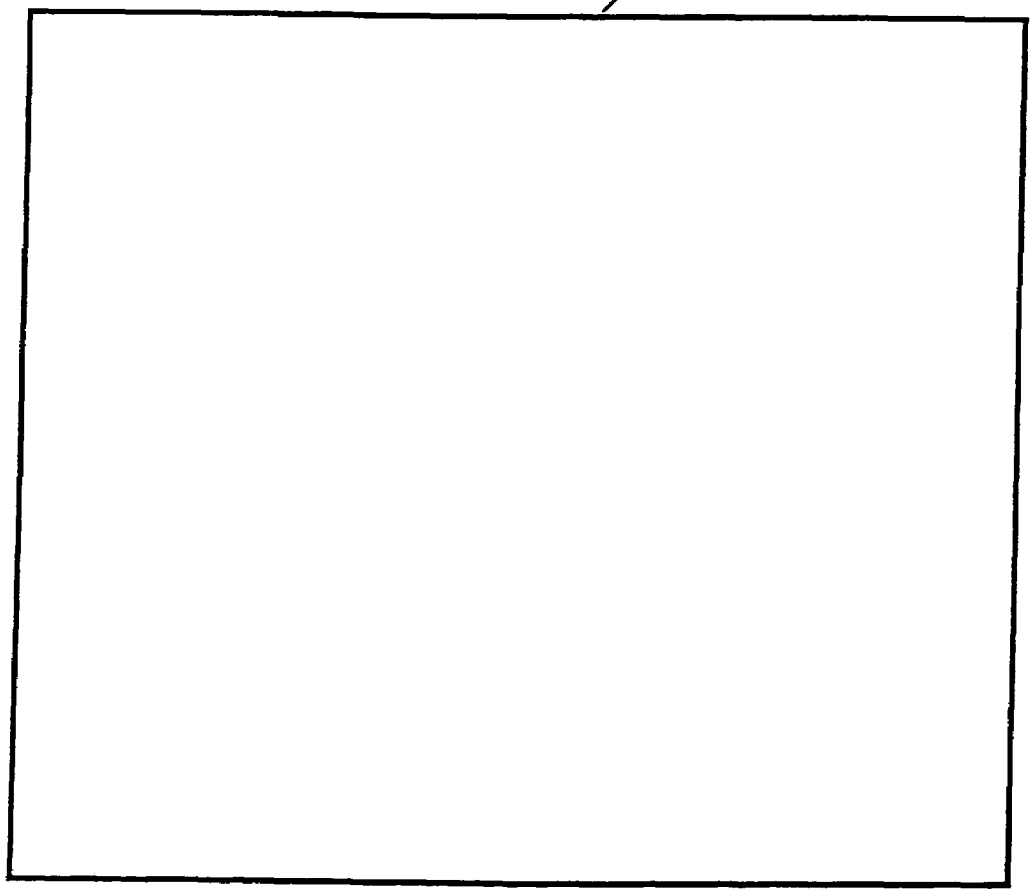

Each of laser beams reflected by the steps of the mirror 604 shaped like steps becomes a laser beam having a width of 5 mm and enters each cylindrical lens forming the cylindrical lens array 605. The width of the cylindrical lens array 605 is determined by the shape of the mirror 604 shaped like steps and the width of each cylindrical lens forming the cylindrical lens array 605 becomes 15 mm in this case. When the laser beams reflected by the mirror 604 shaped like steps are passed through an optical system having a structure similar to FIG. 1, they become a linear laser beam at an irradiate surface. A specific example having a structure similar to FIG. 1 will be described in the following. Each of all lenses described in the following has a curvature in the direction of width.

First, the constitution of an optical system acting in the lateral direction will be described.

The cylindrical lens array 605 is made by setting five cylindrical lenses 15 mm in width, 50 mm in length, 10 mm in thickness, and 90 mm in focal length together in array in the width direction. The cylindrical lens is a flat/convex lens and a convex surface is a spherical surface. In the cylindrical lens used in the present specification, unless otherwise specified, an incident surface is a spherical surface and other surface is a flat surface. To set the cylindrical lenses in array, it is recommended that the cylindrical lenses be bonded to each other by heating or be put in a frame and fixed- to each other from outside. The cylindrical lens array 605 plays a role in dividing the laser beam in the lateral direction.

The laser beams divided in the direction of the width enter a cylindrical lens 606. The cylindrical lens 606 plays a role in unifying the laser beams divided in the width direction at an irradiate surface 611. The cylindrical lens 606 has a width of 50 mm, a length of 50 mm, a thickness of 5 mm, and a focal length of 2250 mm. The cylindrical lens 606 homogenizes the linear laser beam in the length direction of the linear laser beam and determines the length of the linear laser beam. The distance between the cylindrical lens array 605 and the cylindrical lens 606 is 200 mm.

Next, the constitution of an optical system acting in the vertical direction will be described.

The laser beams emitted from the cylindrical lens 606 enter a cylindrical lens array 607a at a distance of 100 mm from the cylindrical lens 606. Each cylindrical lens forming the cylindrical lens array 607a has a width of 3 mm, a length of 60 mm, a thickness of 3 mm, and a focal length of 300 mm. These four cylindrical lenses are put together in the width direction to form the cylindrical lens array 607a. The same method of making the cylindrical lens array 605 may be used for putting together the cylindrical lenses. The laser beam is divided in the vertical direction by the cylindrical lens array 607a.

The laser beams emitted from the cylindrical lens 607a enter a cylindrical lens array 607b at a distance of 443 mm from the cylindrical lens 607a. Each cylindrical lens forming the cylindrical lens array 607b has a width of 3 mm, a length of 60 mm, a thickness of 3 mm, and a focal length of 450 mm. These four cylindrical lenses are put together in the width direction to form the cylindrical lens array 607b. The same method of making the cylindrical lens array 605 may be used for putting together the cylindrical lenses. The laser beams divided by the cylindrical lens array 607a enter each cylindrical lens forming the cylindrical lens array 607b.

The laser beams emitted from the cylindrical lens array 607b enter a cylindrical lens 608 at a distance of 89 mm from the cylindrical lens array 607b. The cylindrical lens 608 has a width of 50 mm, a length of 60 mm, a thickness of 5 mm, and a focal length of 350 mm. The laser beams enter the flat surface of the cylindrical lens 608 having flat/convex surfaces. The laser beams are once unified by the cylindrical lens 608 on the same surface. The same surface is at the focus of the cylindrical lens 608. Since the same surface is in the middle of an optical path, the unified laser beams are separated again.

The laser beams emitted from the cylindrical lens 608 enter a doublet cylindrical lens 609 at a distance of 1377 mm from the cylindrical lens 608. A mirror 613 is interposed between the cylindrical lens 608 and the doublet cylindrical lens 609 because of the arrangement of lenses to change the direction of travel of the laser beam in the downward direction, whereby the substrate can be horizontally arranged which is an object to be irradiated with the laser beam.

The doublet cylindrical lens 609 has a width of 70 mm, a length of 140 mm, a thickness of 31 mm, and a focal length of 177 mm. The laser beams divided in the vertical direction are unified at the irradiate surface 611 by the doublet cylindrical lens 609. The doublet cylindrical lens 609 homogenizes the linear laser beam in the width direction and determines the width of the linear laser beam.

A quartz window 610 having a thickness of 15 mm is arranged between the doublet cylindrical lens 609 and the irradiate surface 611. The distance between the doublet cylindrical lens 609 and the quartz window 610 is 70 mm and the distance between the quartz window 610 and the irradiate surface 611 is 140 mm.

The quartz window 610 is a window fixed to a chamber 612 separating the substrate with a semiconductor film formed thereon from outside air to pass the laser beams. The chamber 612 has an exhaust unit and a gas line (both not shown) connected thereto and the atmosphere in the chamber 612 can be suitably adjusted.

Figure 8:
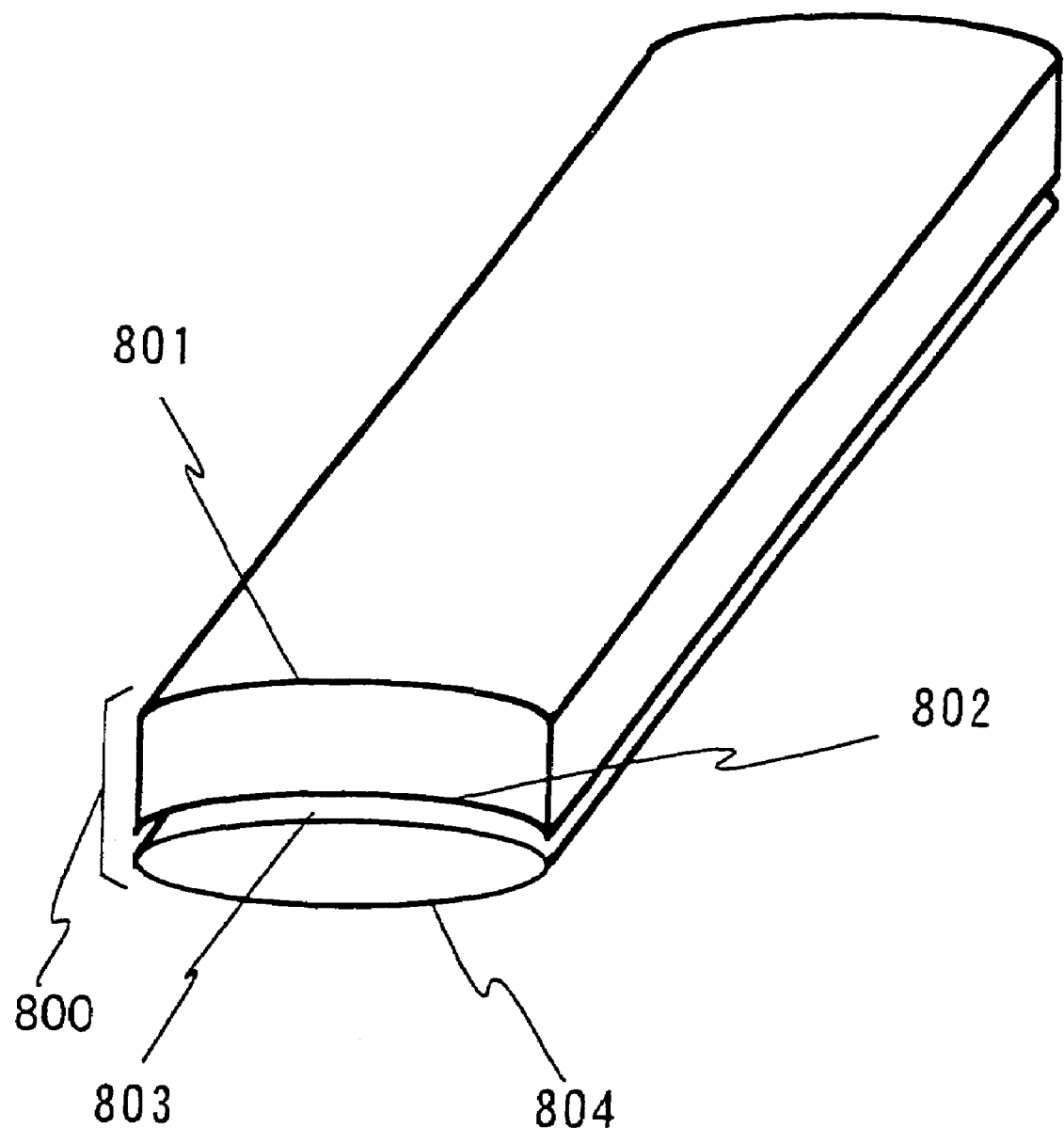
FIG. 8 is an illustration showing lens of a part of an optical system forming a linear laser beam of the present invention.

An example of a specification of the doublet cylindrical lens 609 will be described with reference to FIG. 8. The doublet cylindrical lens 609 has a width of 70 mm, a length of 140 mm, a thickness of 31 mm, and a focal length of 177 mm. A first cylindrical lens has surfaces 801 and 802 and a thickness of 10 mm. The radius of curvature of the surface 801 entered by the laser beam is 125 mm and the radius of curvature of the other surface 802 is 69 mm. A second cylindrical lens has surfaces 803 and 804 and a thickness of 20 mm. The radius of curvature of the surface 803 entered by the laser beam is 75 mm and the radius of curvature of the other surface 802 is −226 mm. The sign attached to the radius of curvature designates the direction of the curvature. Also, the second cylindrical lens is arranged such that the surface 803 entered by the laser beam is at a distance of 1 mm from the surface 802 of the first cylindrical lens. That is, the thickness (31 mm) of the doublet cylindrical lens 609 is the sum of the thickness (10 mm) of the first cylindrical lens, the thickness (20 mm) of the second cylindrical lens, and the distance (1 mm) between the first cylindrical lens and the second cylindrical lens.

To protect the optical system, the atmosphere around the optical system may be a gas resisting to react with a lens-coating material such as a nitrogen gas. For this reason, the optical system may be put in an optical system protection chamber. It is recommended that coated quartz be used for a window through which the laser beams enter or exit from the optical system protection chamber because the coated quartz has a transmittance of 99% or more.

If the energy distribution in the line direction of the linear laser beam is made within ±5%, the linear laser beam can crystallize the a-Si film homogeneously. Preferably, the energy distribution in the line direction of the linear laser beam is made within ±3% and, more preferably, within ±1% to more homogeneously crystallize the a-Si film. To make the energy distribution uniform, the lenses need to be aligned with high accuracy.

The substrate having the a-Si film is arranged at the irradiate surface 611 and a stage 614 is moved at a constant speed in the direction perpendicular to the length direction of the linear laser beam (in the direction of an arrow in FIG. 6) by the use of a moving mechanism 615 with the substrate being irradiated with the laser beam, whereby the whole surface of the substrate can be irradiated with the laser beam. A ball-screw type mechanism or a linear motor can be used as the moving mechanism 615.

It is recommended that irradiation conditions be determined according to the following guidelines: energy density of linear laser beam=50-500 mJ/cm$^2$; moving speed of stage=0.1-2 mm/sec; and oscillation frequency of laser oscillator=30 Hz.

The above conditions may be varied according to the pulse width of the laser oscillator, the state of the semiconductor film, and the specification of a device to be manufactured. Accordingly, the conditions need to be finely set by a practicing person.

The atmosphere in the chamber 612 when the substrate is irradiated with the laser beam is the air set at 20° C. and may be replaced by a $H_2$ gas. The atmosphere is replaced mainly to prevent the contamination of the substrate. The gas is supplied through a gas cylinder. The above atmosphere may be $H_2$, He, $N_2$, Ar, or a mixed gas of these gases. Also, the evacuation of the chamber to a vacuum ($10^{-1}$ Torr or less) also produces an effect of preventing the contamination of the substrate.

In addition to the Corning glass 1737, a glass substrate such as Corning glass 7059, AN 100 can be used as a substrate, or a quartz substrate may be used.

If the spot of the substrate which is being irradiated with the laser beam is further irradiated and heated with strong light, for example, with an infrared lamp, it is possible to reduce the energy of the laser beam as compared with the case where the substrate is not heated with the strong light. The substrate may be heated with a heater arranged under the substrate. In the case where the linear laser beam is further elongated and is applied to a substrate having a larger area or in the case where the energy of the laser beam is not sufficient, the supply of energy by heating is effective.

The laser irradiation device in accordance with the present invention can be applied not only to a non-single crystal silicon film but also to the other non-single crystal semiconductor films, for example, a semiconductor containing germanium and other non-single crystal semiconductor films.

It is recommended that a semiconductor device, for example, a liquid crystal display made of low-temperature polysilicon TFTs, or a semiconductor device invented by a practicing person be manufactured by using a semiconductor film crystallized with the above laser irradiation device by a publicly known method.

Embodiment 1

In the present embodiment, an example will be described in which a polycrystalline silicon film is irradiated with a laser beam. The laser irradiation device described in the above preferred embodiment is used as a laser irradiation device for the present embodiment mode.

A Corning glass 1737 having a thickness of 0.7 mm is used as a substrate. The substrate has sufficient durability if it is used under 600° C. An $SiO_2$ film is formed in 200 nm on one surface of the substrate by a plasma CVD method. Further, an a-Si film is formed in 55 nm on the $SiO_2$ film. Any other film forming method, for example, a sputtering method may be used.

Next, the above-mentioned a-Si film is crystallized by the method disclosed in Japanese Patent Laid-Open No. 7-130652. The method will be described briefly in the following. The above a-Si film is coated with a nickel acetate water solution having a concentration of 10 ppm and then is heated in a nitrogen atmosphere at 550° C. for 4 hours, whereby the a-Si film is crystallized. It is recommended that a spin coat method, for example, be used for applying the nickel acetate water solution. The a-Si film to which nickel is added is crystallized in a short period at low temperatures. It is thought that this is because the nickel acts as the seed crystal of crystal growth to facilitate the crystal growth.

If the polycrystalline silicon film crystallized by the above method is irradiated with the laser beam, it has higher characteristics as a material of a semiconductor device. Accordingly, to improve the characteristics of the above polycrystalline silicon film, the above polycrystalline silicon film is irradiated with the laser beam by using the laser irradiation device used in the preferred embodiment of the present invention.

It is recommended that a semiconductor device, for example, a liquid crystal display made of low-temperature polysilicon TFTs, or a semiconductor device invented by a practicing person be manufactured by using a semiconductor film crystallized with the above laser irradiation device by a publicly known method. The preferred embodiment mode of the present invention and the embodiment 1 can be used in combination.

Embodiment 2

In the present embodiment, an example will be described in which the second harmonic of a YAG laser is used as a laser oscillator. The advantage of using the second harmonic resides in that an optical lens resists being degraded by the second harmonic. Also, since the second harmonic has a lower reflectance to the a-Si film than the third harmonic or the fourth harmonic, the energy efficiency obtained when the second harmonic is used is slightly lower than the energy efficiency obtained when the third harmonic or the fourth harmonic is used. The maximum pulse energy now in existence is 1400 mJ/pulse. This is two times the third harmonic and hence it is recommended that the elongated linear laser beam of the second harmonic be used for crystallizing the a-Si film formed on a substrate having a large area.

It is recommended that the same laser irradiation device and method as those described in the preferred embodiment of the present invention be used as the device and method for transforming the second harmonic into a linear laser beam and applying it to semiconductor film. However, since the third harmonic is different in a wavelength from the second harmonic, it is necessary to change the focal point. In the case of the present embodiment, it is recommended that the distance between the quartz window 610 and the irradiate surface 611 be changed to 150 mm. The coating of the lens is adapted to the wavelength (530 nm) of the second harmonic of the YAG laser.

The embodiment 2 can be combined with the embodiment 1.

Embodiment 3

In the present embodiment, an example will be described in which the fourth harmonic of a YAG laser is used as a laser oscillator. The advantage of using the fourth harmonic resides in that the absorption coefficient of the fourth harmonic to a silicon film is very high.

It is recommended that the same laser irradiation device and method as those described in the preferred embodiment of the present invention be used as the device and method for transforming the fourth harmonic into a linear laser beam and applying it to semiconductor film. However, since the fourth harmonic is different in a wavelength from the third harmonic, it is necessary to change the focal point. In the case of the present embodiment, it is recommended that the distance between the quartz window 610 and the irradiate surface 611 be changed to 126 mm. The coating of the lens is adapted to the wavelength (266 nm) of the fourth harmonic of the YAG laser.

The embodiment 3 can be combined with the embodiment 1.

Embodiment 4

Figure 9:
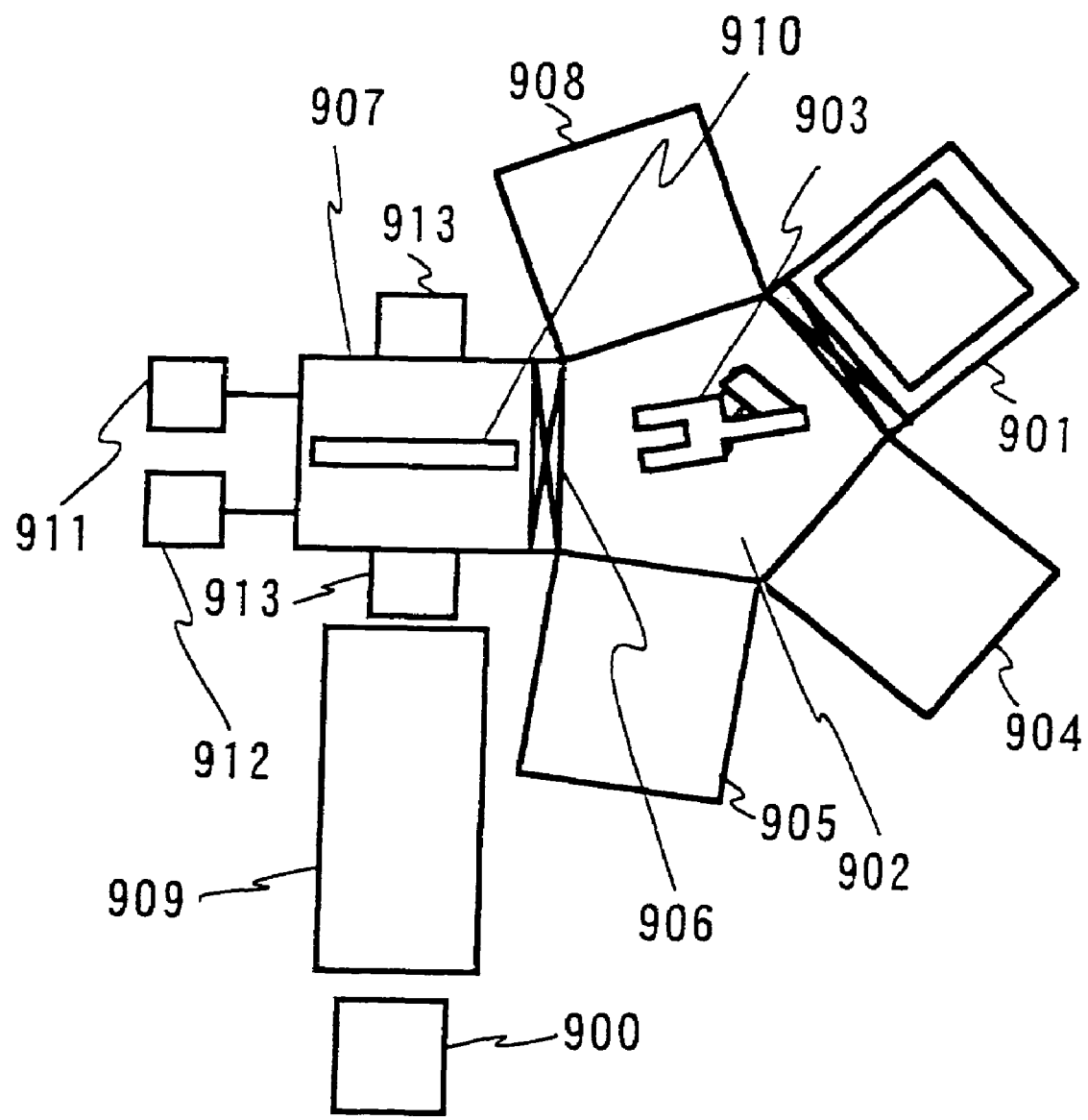
FIG. 9 is an illustration showing a laser irradiation device for mass production of Embodiment 4.

In the present embodiment, an example of a laser irradiation device for mass production will be described with reference to FIG. 9. FIG. 9 is a top view of a laser irradiation device.

A substrate is carried from a load/unload chamber 901 by the use of a carrying robot arm 903 mounted in a transfer chamber 902. First, the substrate is aligned in an alignment chamber 904 and then is carried to a pre-heat chamber 905. In the pre-heat chamber 905, the substrate is previously heated to a desired temperature of about 300° C., for example, by the use of an infrared lamp heater. Then, the substrate is placed in a laser irradiation chamber 907 via a gate valve 906 and then the gate valve 906 is closed.

A laser beam is emitted by the laser oscillator 900 described in the preferred embodiment mode in accordance with the present invention and then is bent downward. 90 degrees by a mirror (not shown) placed directly above a quartz window 910 via an optical system 909 and is transformed into a linear laser beam at an irradiate surface in the laser irradiation chamber 907 via the quartz window 910. The laser beam is applied to the substrate placed at the irradiate surface. It is recommended that the above-mentioned optical system be used as the optical system 909, or the one similar to the optical system may be used.

The laser irradiation chamber 907 is evacuated by a vacuum pump 911 to make the atmosphere of the chamber 907 a high vacuum of about $10^{-3}$ Pa before the irradiation of the laser beam, or the atmosphere of the laser irradiation chamber 907 is made a desired atmosphere by the vacuum pump 911 and a gas cylinder 912. As described above, the above atmosphere may be He, Ar, $H_2$, or the mixed gas of them.

Then, the substrate is scanned and irradiated with the linear laser beam moved by a moving mechanism 913. At this time, an infrared lamp (not shown) may be applied to the spot of the substrate irradiated with the linear laser beam.

After the end of the irradiation of the laser beam, the substrate is carried to a cooling chamber 908 to be allowed to cool slowly and then is returned to the load/unload chamber 901 via the alignment chamber 904. In this manner, many substrates can be annealed with laser by repeating these actions.

The embodiment 4 can be used in combination with the preferred embodiment mode and the other embodiments of the present invention.

Embodiment 5

Figure 10:
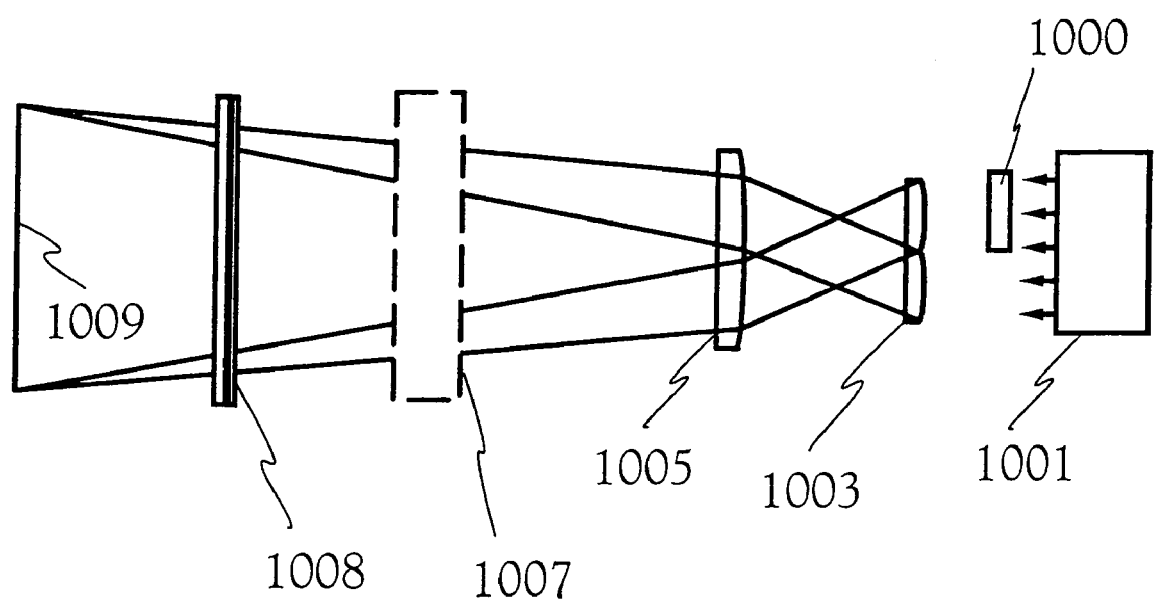
FIG. 10 shows an example of a laser irradiation device of Embodiment 5.

In Embodiment 5, an example that a quartz plate is used as a means for producing an optical path difference is described, as shown in FIG. 10. This quartz plate is transparent with respect to the laser beam.

In FIG. 10, a structural example of an optical system for processing a sectional shape of the laser beam into a linear shape on an irradiate surface is shown. FIG. 10 is a drawing of a top view.

A part of a laser barn emitted by laser oscillator 1001 enters a quartz plate 100 with a thickness of 15 mm, so that an optical path difference is generated between the part and another part of the laser beam that does not enter the quartz plate 1000. A refractive index of the quartz plate 1000 is about 1.5 with respect to wave length 532 nm. Accordingly, an optical difference of about 7 mm is generated. Such the optical difference of 7 mm is equal to the coherence length of the YAG laser, an effect to prevent an interference is expected.

The laser beam which is lengthened through the quartz plate 1000 enters one cylindrical lens of a cylindrical lens array 1003, while the laser beam which does not pass through the quartz plate 1000 enters the other cylindrical lens of the cylindrical lens array 1003, to be divided into two portions. Then, the laser beams are unified to one laser beam on an irradiate surface 1009 by a cylindrical lens 1005. Thus, the energy in the length direction of the linear laser beam is homogenized and the length of the linear laser beam is determined.

Figure 11A:
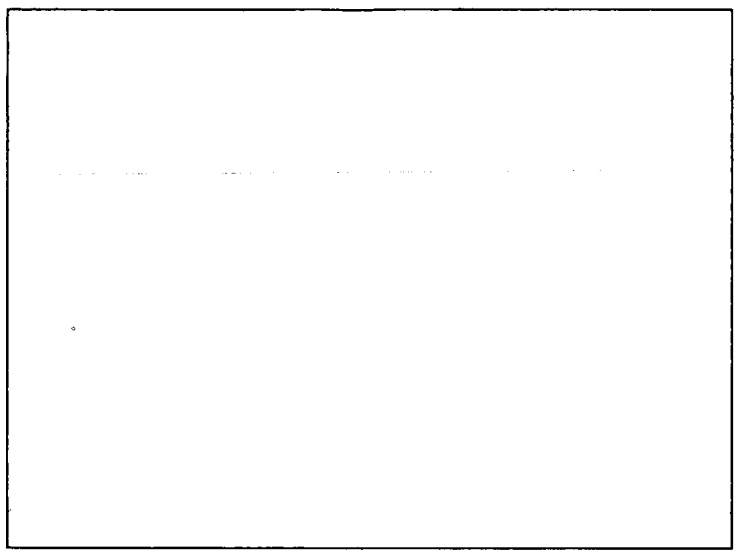
FIG. 11A is a photograph showing a surface state of a silicon film of Embodiment 5 and FIG. 11B is an image of the linear laser beam taken by a CCD camera of Embodiment 5.

Like this, the laser beam having the optical path difference by the quartz plate is irradiated into an amorphous silicon (a-Si) film. As shown in FIG. 11A, fringes in a direction parallel to the width direction of the linear laser beam can be eliminated. It is noted that a vertical direction of FIG. 11A corresponds to the width direction of the linear laser beam.

Figure 11B:
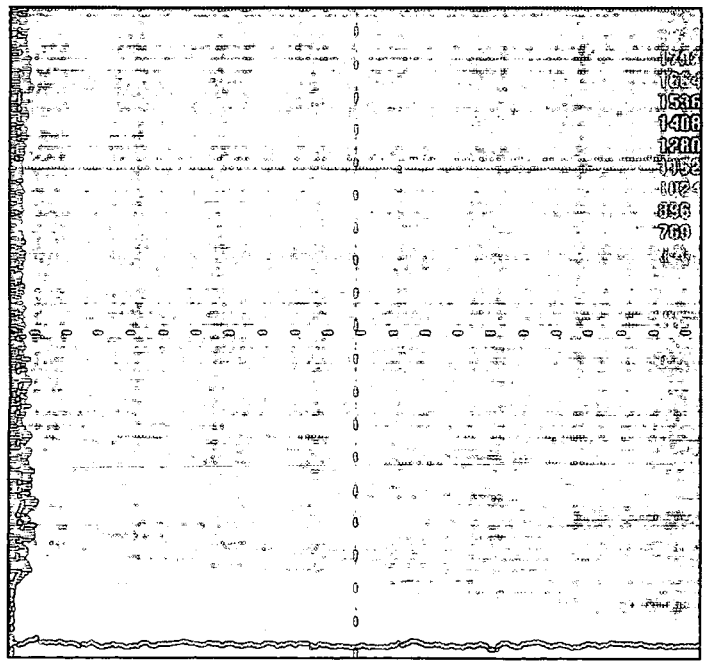

FIG. 11A is a photograph showing a surface state of an amorphous silicon film irradiated with the linear laser beam processed through the present embodiment. Further, FIG. 11B is an image of the linear laser beam processed through the present embodiment taken by a CCD camera.

Figure 12A:
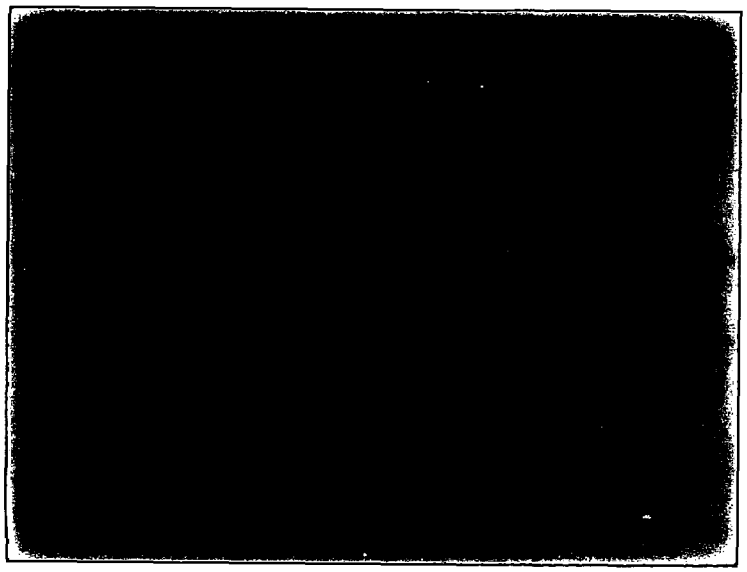
FIG. 12A is a photograph showing a surface state of a silicon film of the compared example and FIG. 12B is an image of the linear laser beam taken by a CCD camera of the compared example.
Figure 12B:
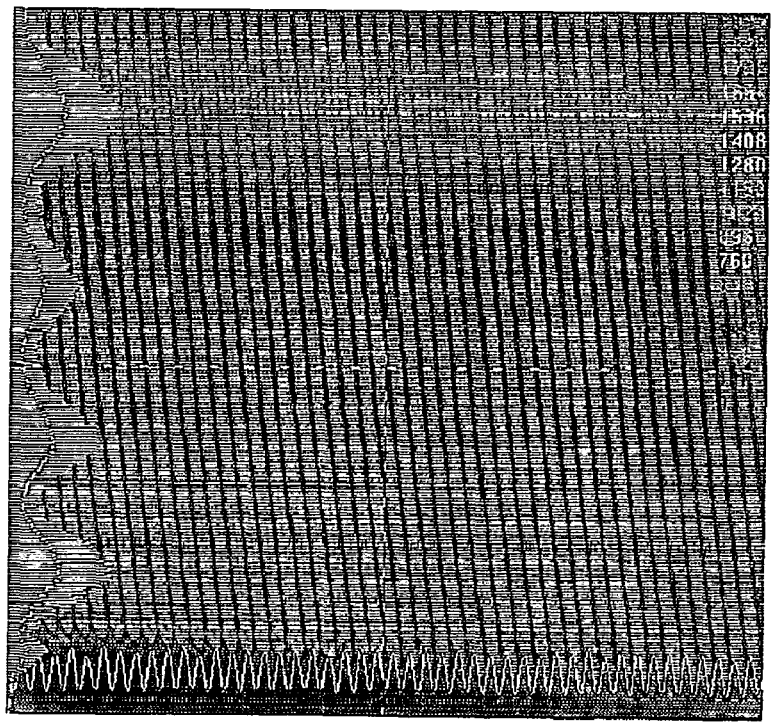

In order to compare, without the optical path difference, that is, a linear laser beam processed without using the quartz plate 1000 is irradiated into an amorphous silicon film. A surface state of such the amorphous silicon film is shown in a photograph of FIG. 12A. In addition, FIG. 12B is an image of the linear laser beam without the optical path difference, that is, which is processed without using the quartz plate 1000 is taken by CCD camera. Because of the interference, the fringes parallel to the width direction of the linear laser beam are generated.

In Embodiment 5, an example that the laser beam is divided into two portions and unified is indicated. However, in a case that a laser beam can be divided into three portions or more and unified into one, if the divided laser beams have efficient optical path differences, a same effect as the present embodiment can be obtained. For example, when the laser beam is divided into three portions, it is proper to unify one laser beam not entering the quartz plate, another laser beam passing through a quartz plate with a thickness t, and another laser beam passing through a quartz plate with a thickness 2t. Further, the thickness t can be determined taking account of coherence length of the laser beam used.

Furthermore, reference numeral 1007 indicates a mirror in FIG. 10.

The present invention can extremely decrease strong and weak portions of interference fringes generated parallel to the width direction of the linear laser beam.

What is claimed is:

1. A method of fabricating a semiconductor device, the method comprising:
   irradiating a beam expander with a laser beam from a laser oscillator;
   dividing the laser beam passed through the beam expander into at least first and second laser beams having a difference in an optical path length larger than a coherence length of the laser beam in a longitudinal direction;
   overlapping the first and second laser beams to homogenize the first and second laser beams at an irradiation surface of a semiconductor film;
   converging the first and second laser beams in a width direction of the first and second laser beams to irradiate the first and second laser beams at the irradiation surface, the first and second laser beams having a linear shape in a cross section at the irradiation surface; and
   crystallizing the semiconductor film by the irradiation of the converged first and second laser beams.

2. The method of fabricating a semiconductor device according to claim 1, wherein the laser beam passed through the beam expander is divided by a step-like mirror.

3. The method of fabricating a semiconductor device according to claim 1, wherein the laser oscillator generates a second harmonic of a YAG laser.

4. The method of fabricating a semiconductor device according to claim 1, wherein the laser oscillator generates a third harmonic of a YAG laser.

5. The method of fabricating a semiconductor device according to claim 1, wherein the laser oscillator generates a fourth harmonic of a YAG laser.

6. The method of fabricating a semiconductor device according to claim 1, wherein the laser oscillator generates an Ar laser.

7. A method of fabricating a semiconductor device, the method comprising:
   irradiating first and second cylindrical lenses with a laser beam from a laser oscillator;
   dividing the laser beam transformed by the first and second cylindrical lenses into at least first and second laser beams having a difference in an optical path length larger than a coherence length of the laser beam in a longitudinal direction;
   overlapping the first and second laser beams to homogenize the first and second laser beams at an irradiation surface of a semiconductor film;
   converging the first and second laser beams in a width direction of the first and second laser beams to irradiate the first and second laser beams at the irradiation surface, the first and second laser beams having a linear shape in a cross section at the irradiation surface; and
   crystallizing the semiconductor film by the irradiation of the converged first and second laser beams.

8. The method of fabricating a semiconductor device according to claim 7, wherein the laser beam transformed by the first and second cylindrical lenses is divided by a step-like mirror.

9. The method of fabricating a semiconductor device according to claim 7, wherein the laser oscillator generates a second harmonic of a YAG laser.

10. The method of fabricating a semiconductor device according to claim 7, wherein the laser oscillator generates a third harmonic of a YAG laser.

11. The method of fabricating a semiconductor device according to claim 7, wherein the laser oscillator generates a fourth harmonic of a YAG laser.

12. The method of fabricating a semiconductor device according to claim 7, wherein the laser oscillator generates an Ar laser.

* * * * *